(12) United States Patent
Hsieh

(10) Patent No.: US 7,076,870 B2
(45) Date of Patent: Jul. 18, 2006

(54) MANUFACTURING PROCESS FOR A SURFACE-MOUNT METAL-CAVITY PACKAGE FOR AN OSCILLATOR CRYSTAL BLANK

(75) Inventor: Wen-Lo Hsieh, Kaohsiung (TW)

(73) Assignee: Pericom Semiconductor Corp., San Jose, CA (US)

( * ) Notice: Subject to any disclaimer, the term of this patent is extended or adjusted under 35 U.S.C. 154(b) by 129 days.

(21) Appl. No.: 10/710,978

(22) Filed: Aug. 16, 2004

(65) Prior Publication Data

US 2006/0032051 A1  Feb. 16, 2006

(51) Int. Cl.
*H05K 3/10* (2006.01)
*H01K 3/10* (2006.01)

(52) U.S. Cl. .......................... 29/852; 29/831; 29/846; 29/847; 29/25.35; 216/19; 438/720

(58) Field of Classification Search .......... 29/852–846, 29/847–831, 25.35; 205/118, 123, 125; 216/13, 216/17–19, 100; 438/706, 710, 719, 720; 174/264; 257/698; 427/96.1, 443.1
See application file for complete search history.

(56) References Cited

U.S. PATENT DOCUMENTS

| | | | |
|---|---|---|---|
| 3,624,555 A | 11/1971 | Klein | 331/107 DP |
| 4,511,860 A | 4/1985 | Bastida et al. | 331/96 |
| 4,609,883 A | 9/1986 | Mizumura et al. | 331/96 |
| 4,627,533 A | 12/1986 | Pollard | 331/177 R |
| 4,845,397 A | 7/1989 | Herrick et al. | 310/348 |
| 5,438,219 A | 8/1995 | Kotzan et al. | 257/469 |
| 5,571,363 A * | 11/1996 | Brosig et al. | 156/292 |
| 5,578,869 A * | 11/1996 | Hoffman et al. | 257/691 |
| 6,087,759 A | 7/2000 | Pfeil | 310/321 |
| 6,229,249 B1 | 5/2001 | Hatanaka et al. | 310/348 |
| 6,320,256 B1 | 11/2001 | Ho | 257/691 |
| 6,456,168 B1 | 9/2002 | Luff | 331/68 |
| 6,495,914 B1 * | 12/2002 | Sekine et al. | 257/723 |
| 6,559,728 B1 * | 5/2003 | Fry | 331/69 |
| 2003/0058056 A1 * | 3/2003 | Moriya et al. | 331/158 |
| 2003/0197569 A1 * | 10/2003 | Mizusawa | 331/158 |
| 2005/0055814 A1 * | 3/2005 | Hatanaka et al. | 29/25.35 |

* cited by examiner

*Primary Examiner*—David P. Bryant
*Assistant Examiner*—Sarang Afzali
(74) *Attorney, Agent, or Firm*—Stuart T. Auvinen

(57) ABSTRACT

A surface-mount package for an oscillator crystal blank is made from a metal sheet substrate. Half-etched cavities are formed on one side of the sheet. The half-etched cavities are filled in with an insulator. The center of the insulator is drilled until metal is reached, leaving insulator on the sidewalls of the resulting drilled via. The bottom of the drilled via is plated with a contact metal such as nickel-gold, and then the entire drilled via is filled in with metal such as copper to form via-metal. An external metal surface-mount pad is formed on the surface of each via-metal. The metal sheet is flipped over, and a larger inner cavity etched through until the contact metal over the via-metal is reached. Conductive epoxy is placed on the contact metal, and electrodes on the crystal blank are attached to conductive epoxy.

18 Claims, 17 Drawing Sheets

MANUFACTURING PROCESS FOR A SURFACE-MOUNT METAL-CAVITY PACKAGE FOR AN OSCILLATOR CRYSTAL BLANK

BACKGROUND OF INVENTION

This invention relates to electronics packaging, and more particularly to packages with metal cavities for crystal oscillators.

Precise clocks for electronic systems are often generated by a crystal oscillator that is coupled to a crystal blank. The crystal oscillator applies a voltage difference across the crystal blank, causing the crystal blank to vibrate at a desired frequency. The crystal oscillator can then amplify and buffer this oscillating signal from the crystal blank to output a clock.

Crystal blanks can be packaged in various packages, such as dual-inline-pin (DIP) packages made of materials such as plastic, ceramic, or metal. However, DIP packages have pins that are inserted into holes in a printed-circuit board (PCB), thus requiring board space on both sides of the PCB.

Surface-mount packages have pins or leads that are bent to be parallel to the PCB surface, or may have solder balls or flat pads for soldering to one surface of the PCB. The surface-mount package does not require holes in the PCB, so only one side of the PCB is occupied by the surface-mount package, saving board space. Also, surface mount packages tend to be smaller than DIP packages.

Crystal blanks have been packaged in ceramic surface-mount packages. It is desirable to mount crystal blanks in metal packages for some applications. A lower cost packaging process may result, and development times may be reduced. A metal, surface-mount package for a crystal blank is desirable.

DETAILED DESCRIPTION

The present invention relates to an improvement in surface-mount packages fro crystal blanks. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
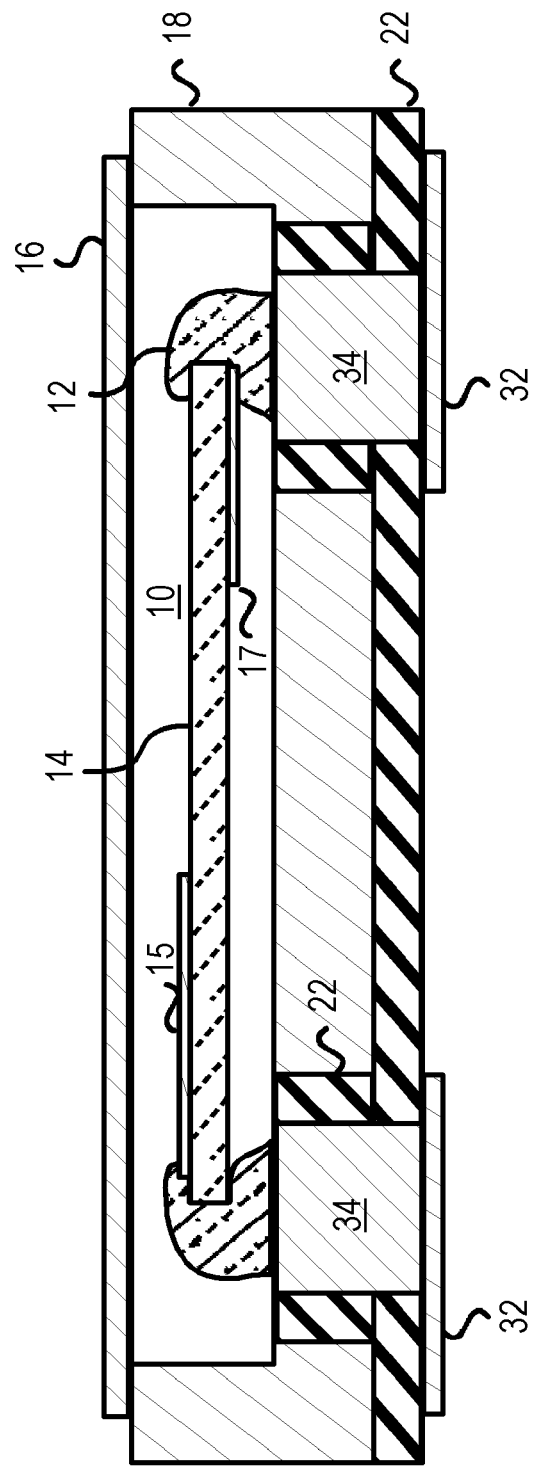
FIG. 1 shows a metal surface-mount package for a crystal blank.

FIG. 1 shows a metal surface-mount package for a crystal blank. Metal package body 18 is made from a metal such as copper, a copper alloy, a nickel-iron alloy, or other metals or alloys. Within inner cavity 10 of metal package body 18 is mounted crystal blank 14, which can be a quartz crystal that vibrates at a frequency when an electric field is applied.

Cover 16 can be a lid of metal or other material with good moisture resistance and stiffness. Cover 16 covers the top opening of inner cavity 10 after crystal blank 14 is mounted within inner cavity 10.

The surface-mount package is soldered to a surface of a PCB by applying solder paste to the underside of external pads 32. When the surface mount package is placed on the surface of the PCB, external pads 32 are aligned to pad areas on the PCB, and heat is applied to re-flow the solder paste and form solder bonds to external pads 32.

Crystal blank 14 has metal electrodes 15, 17 formed on its surfaces. Electrodes 15, 17 connect to external pads 32 through via metal 34 and conductive epoxy 12. Conductive epoxy 12 electrically conducts and is attached to one of the electrodes of crystal blank 14, while a second drop of conductive epoxy 12 is attached to the other electrode. For example, conductive epoxy 12 for the left external pad 32 may connect to the top electrode of crystal blank 14, while another external pad 32 on the right may have conductive epoxy 12 that attaches only to the bottom electrode of crystal blank 14. Electrodes on crystal blank 14 may be patterned, with cut outs to prevent undesired contact to conductive epoxy 12. Other orientations of electrodes and attachment to conductive epoxy drops within the package are possible.

Insulator 22 is formed on the bottom of metal package body 18 to prevent electrical shorting between external pads 32 and metal package body 18. Insulator 22 is also formed on the side walls of via metal 34 to prevent electrical shorting of via metal 34 to metal package body 18.

Crystal blank 14 is mechanically held within inner cavity 10 by two drops of conductive epoxy that connect to different electrodes on the crystal blank, and two different vias to different external metal pads. The attachment points to the crystal blank may be on the same side of the blank, or on opposite sides, or have some other orientation.

Simple Etch Process—FIGS. 2–8

Figure 2A:
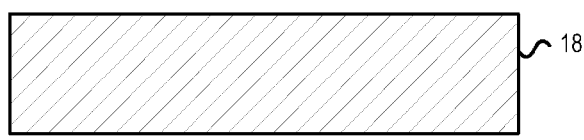
FIGS. 2A–L show steps in a process to make the metal surface-mount crystal package that operate on the underside surface.
Figure 2B:
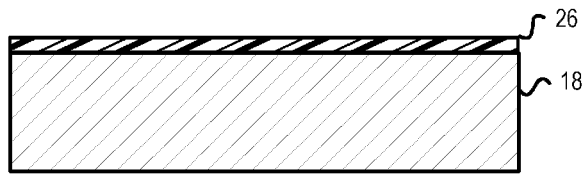
Figure 2C:
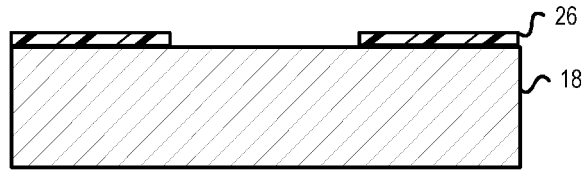

FIGS. 2A–K show steps in a process to make the metal surface-mount crystal package that operate on the underside surface. In FIG. 2A, a sheet of metal material such as copper, copper-alloy, nickel-iron, or other metal is the starting material. This metal forms metal package body 18. In FIG. 2B, a photo-sensitive layer such as a photo-resist is placed on the top surface of the metal sheet, such as by spinning it on. Resist layer 26 is then exposed using a mask to shade portions of it and developed, leaving one or more holes or openings in resist layer 26 as shown in FIG. 2C.

Figure 2D:
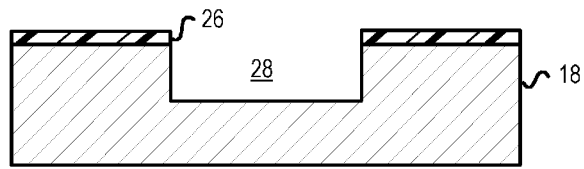
Figure 2E:
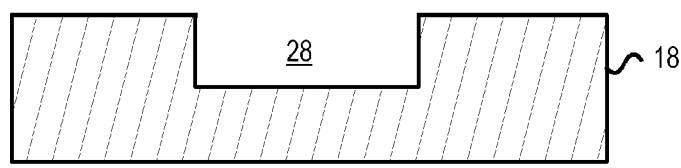

In FIG. 2D, etching is performed to create half-etched cavity 28 in metal package body 18 where the opening in resist layer 26 has exposed metal package body 18 to the etchant. Resist layer 26 is then removed, leaving metal package body 18 with half-etched hole 28 in it, as shown in FIG. 2E.

Figure 2F:
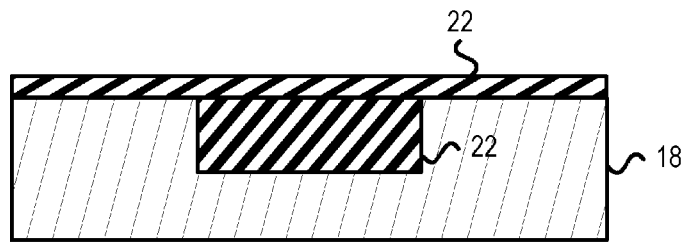

Insulator 22 is then deposited over the surface of metal package body 18 (FIG. 2F). Half-etched cavity 28 is filled in with insulator 22. A flat top surface to insulator 22 can be achieved by a spin-on insulating material that can flow to fill in half-etched cavity 28. Alternately, insulator 22 can be deposited to fill in half-etched cavity 28 and then etched back to provide a flat surface to metal package body 18, and then additional insulator 22 material can be deposited over the flat surface of metal package body 18.

Figure 2G:
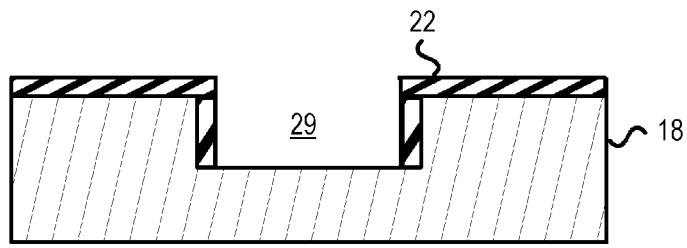

A mechanical drill, laser, or a chemical etch can be used to make drilled via 29 in insulator 22 that filled in half-etched cavity 28. Since drilled via 29 is smaller in surface area than half-etched cavity 28, some of insulator 22 remains inside half-etched cavity 28 along the walls of metal package body 18. However, the bottom of drilled via 29 reaches through insulator 22 to reach metal package body 18, as shown in FIG. 2G.

Figure 2H:
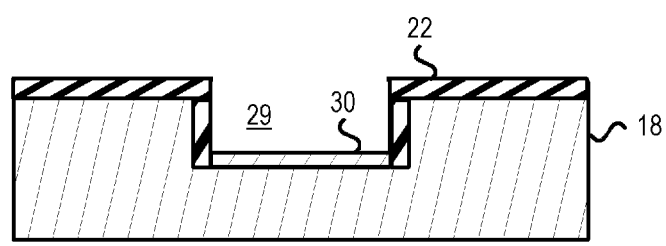

In FIG. 2H, a thin layer of gold and then a thin layer of nickel are plated onto the bottom of drilled via 29. Plated metal layer 30 is formed on the bottom of drilled via 29 where metal package body 18 is exposed and not over insulator 22, since plating occurs where the exposed surface can be electrically charged. Insulator 22 is not electrically charged because it is not a conductor. An electrical insulating material may be placed on the opposite surface to prevent plating on other surfaces.

Figure 2I:
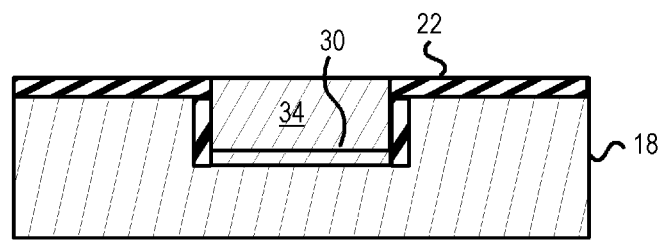

In FIG. 2I, plating continues after plated metal layer 30 is deposited. A thicker layer of copper is plated over thin plated metal layer 30. Enough copper is plated to fill in drilled via 29 to the surface of insulator 22, forming via metal 34.

Figure 2J:
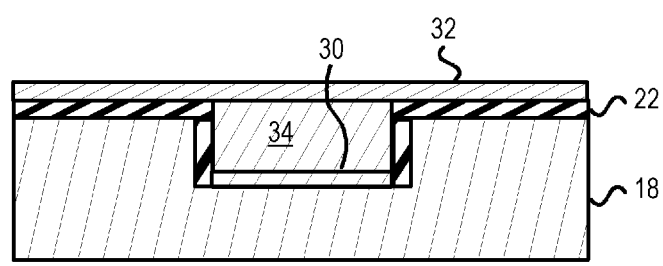

In FIG. 2J, a layer of metal is deposited over insulator 22 and over via metal 34. This metal layer is used to form all of external pads 32. This metal makes electrical contact with via metal 34 but is insulated from metal package body 18 by insulator 22. Rather than deposit the metal, a metal foil such as a copper foil may be laminated onto the surface.

Figure 2K:
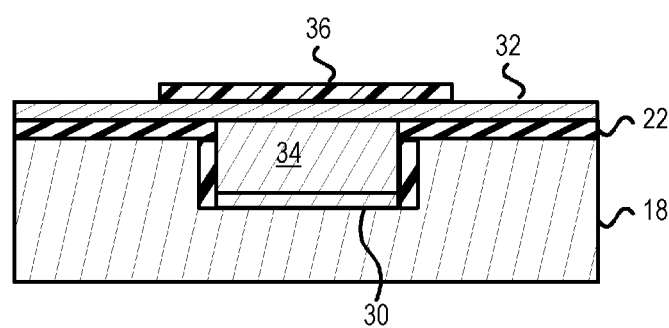
Figure 2L:
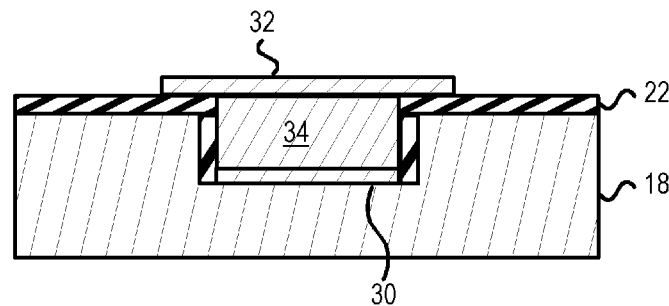

In FIG. 2K, another resist layer 36 is deposited over the top metal layer forming external pads 32. This resist layer 36 is exposed using a mask and developed to form patterns in resist layer 36. Openings in resist layer 36 expose the top metal layer for etching. After metal etching, only external pads 32 in the top metal layer remain, as shown in FIG. 2L after removal of resist layer 36.

FIGS. 3A–D shows steps in a process to make the metal surface-mount crystal package that operate on the top-side surface. The partially-formed surface mount package of FIG. 2K is flipped over so that steps can be operated on the top-side surface rather than the bottom or under-side surface of metal package body 18.

Figure 3A:
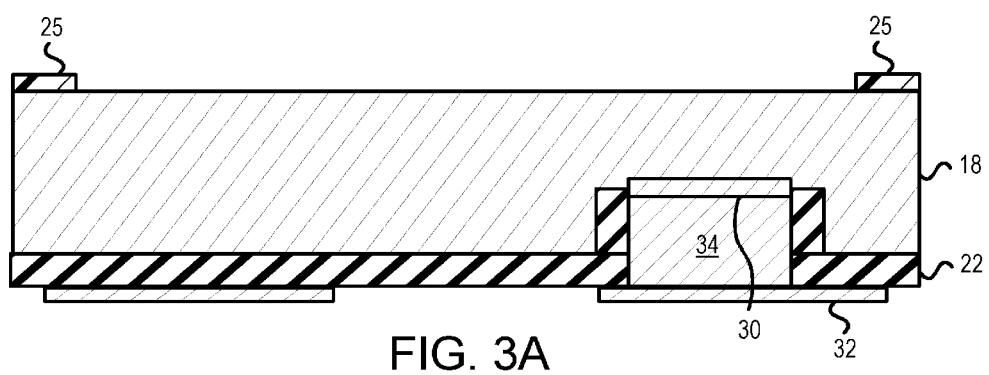
FIGS. 3A–D show steps in a process to make the metal surface-mount crystal package that operate on the top-side surface.
Figure 3B:
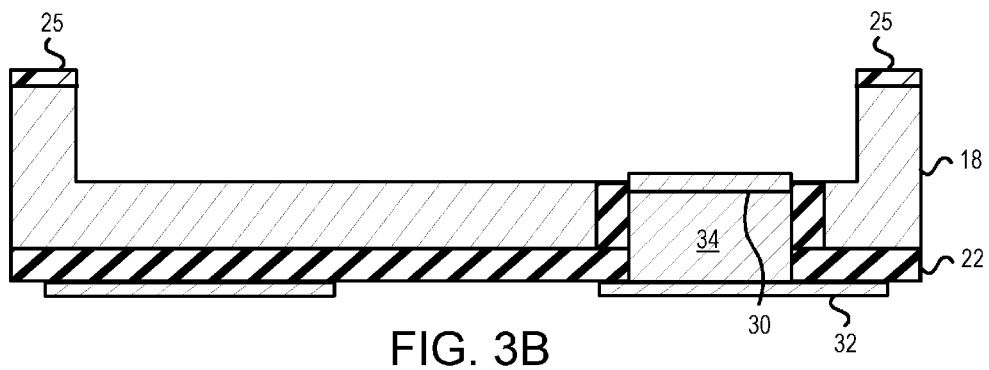
Figure 3C:
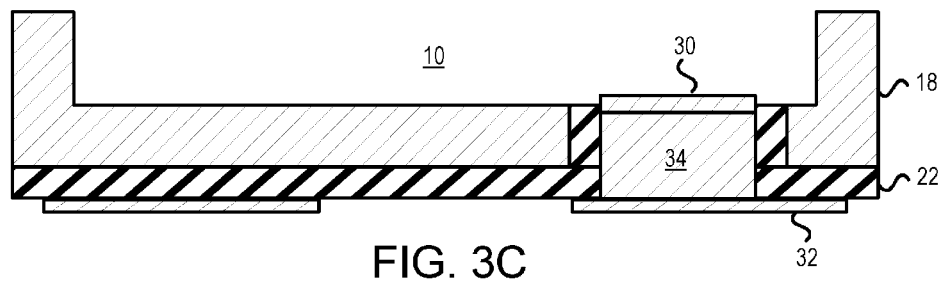

In FIG. 3A, the inverted metal package body 18 has photo-resist layer 25 applied to the surface opposite external pads 32. Resist layer 25 is exposed using a mask or a scanning beam, and developed (FIG. 3B). Then etching is performed to make inner cavity 10, and the remaining portions of resist layer 25 are removed, FIG. 3C. Since plated metal layer 30 may be made from a more durable metal than metal package body 18, plated metal layer 30 may resist etching and protrude somewhat from the bottom of inner cavity 10 as shown.

The metal sheet containing many metal package bodies 18 can be separated into panels of a few metal package bodies 18. Scribe lines can be pre-etched to facilitate later separating into individual metal package bodies 18 to remove stress when sawing. Alternatively, separating into panels and into individual packages can be performed by sawing or other cutting.

Figure 3D:
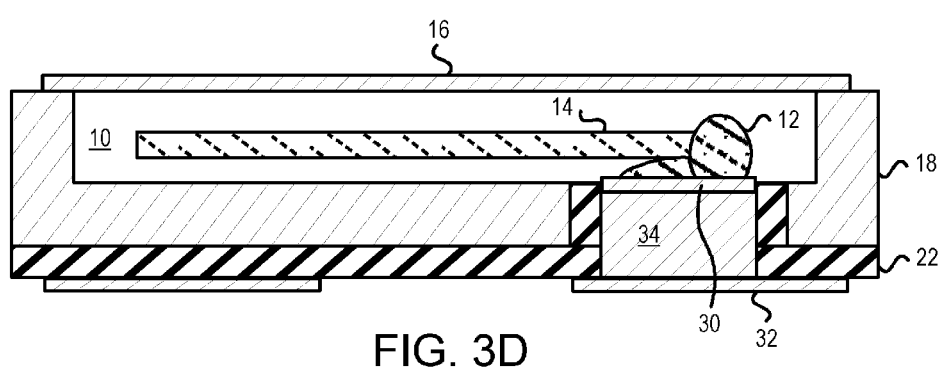

In FIG. 3D, conductive epoxy 12 is applied to plated metal layer 30 within inner cavity 10. Plated metal layer 30 over via metal 34 acts as an attach pad. Then crystal blank 14 is placed over inner cavity 10, aligned, and pushed into conductive epoxy 12. Conductive epoxy 12 is then cured, such as by exposure to heat or ultra-violet or other light.

Cover 16 is then attached to metal package body 18 over inner cavity 10. Cover attachment can be performed in a pure nitrogen-gas (N2) atmosphere to keep moisture out of inner cavity 10 during sealing. After assembly the individual metal package bodies 18 on a panel can be separated by sawing the scribe lines between metal package bodies 18.

Conductive epoxy 12 can be applied as two drops or balls as shown in FIG. 3D, or as a single drop or ball as shown in FIG. 1. One of the electrodes on crystal blank 14 is contacted by conductive epoxy 12.

Figure 4A:
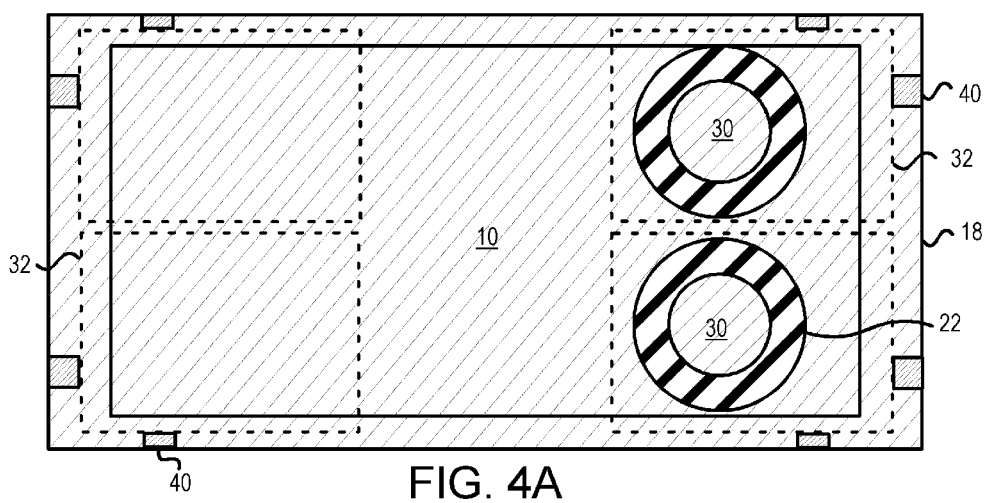
FIG. 4A is a top view and FIG. 4B is a cross-sectional side view of the surface-mount metal package body produced by the process of FIGS. 2–3.
Figure 4B:
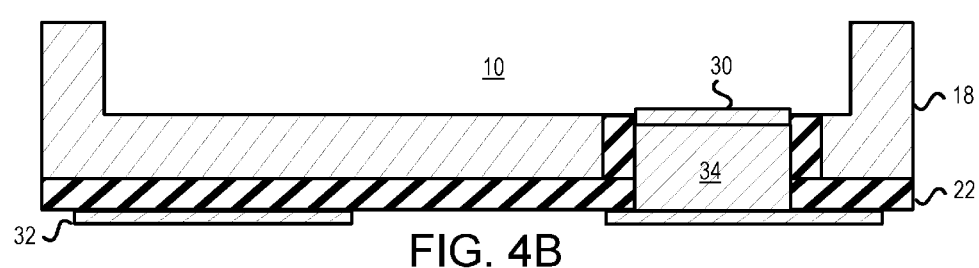

FIG. 4A is a top view and FIG. 4B is a cross-sectional side view of the surface-mount metal package body produced by the process of FIGS. 2–3. Cover 16, crystal blank 14, and conductive epoxy 12 are removed in these diagrams.

Four external pads 32 are formed near the four corners of metal package body 18. Since there are only two terminals of crystal blank 14, pairs of these external pads 32 may be shorted together, or two may be left floating and used for mechanically supporting metal package body 18 when surface-mounted to a PCB.

Inside inner cavity 10 are two circles of plated metal layer 30, each one over via metal 34 that connects to one of the underlying external pads 32. Electrical connection from crystal blank 14 inside inner cavity 10 is provided through plated metal layer 30 and via metal 34 to external pads 32.

Plated metal layer 30 and via metal 34 are separated from metal package body 18 by insulator 22 on the sides of via metal 34, forming a doughnut or ring shape around plated metal layer 30 as shown in the top view (FIG. 4A).

Edge connecting metal pads 40 connect to all external pads 32, and to the edge of the package. When many packages are formed on a panel, these edge connecting metal pads 40 connect to metal lines within the scribe lines between packages, and can be powered during plating. Thus external pads 32 are electrically charged during plating by connection with buses in the scribe lines through edge connecting metal pads 40. The scribe-line buses are disconnected, isolating each external pad 32, during package separation or sawing of the scribe lines.

Figure 5:
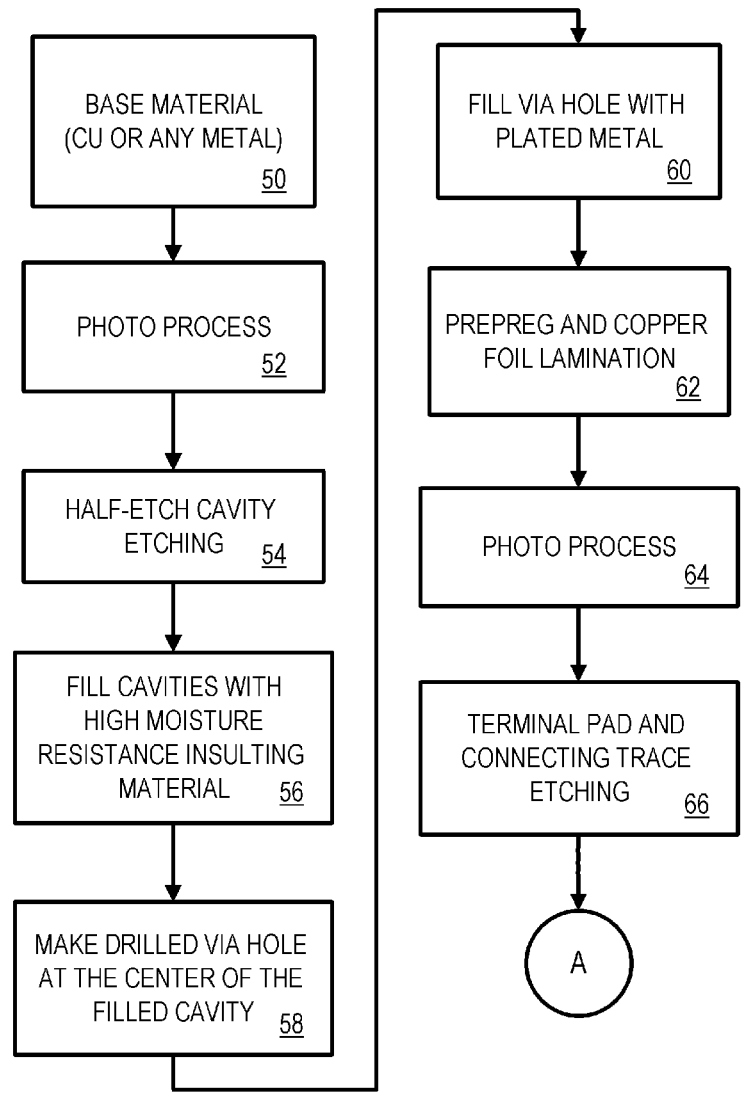
FIG. 5 is a flowchart of a first process for making a surface-mount package having a metal package body.

FIG. 5 is a flowchart of a first process for making a surface-mount package having a metal package body. This first embodiment corresponds to FIGS. 1–4. The base material is a metal such as copper, copper-alloy, or iron-nickel, step 50. The material can be a sheet that allows for many metal package bodies 18 to be formed thereon. Photo-resist is applied to one surface of the metal sheet, step 52, and the photo resist is exposed using a pattern and developed. The openings in the developed photo-resist are etched, step 54, to create the half-etched cavities 28. The remaining photo-resist is stripped off.

A moisture-resistant insulating material such as glass or a silica-filled polymer epoxy material is applied to the surface of the metal sheet, and the insulator fills in the half-etched cavities, step 56. A laser or drill is used to drill a hole in the middle of the half-etched cavities that were filled in with the insulator. The drill drills through the insulator within the cavities to reach the underlying metal, step 58. These are the drilled vias 29. Insulator remains around the perimeter walls of the drilled vias.

The drilled vias are filled with plated metal, step 60. A gold-nickel plated metal contact layer is first formed at the bottom of the drilled vias. Then the rest of the drilled vias are filled in with plated copper up to the surface level of the metal sheet.

A prepeg preparation process (such as application of a compound of insulating glass fibers and epoxy) is used to prepare the surface of the metal sheet for lamination, and then copper foil is laminated onto the surface of the metal sheet, step 62. The drilled vias that were filled in with the plated copper in step 60 are also covered with the laminated copper foil, which makes a good electrical contact with the filled-in vias.

Photo-resist is applied to the copper-foil surface, and exposed and developed to form a pattern of external pads 32 and any connecting buses or traces, step 64. A metal etch is then performed, step 66, to pattern the copper foil into external pads 32 and any connecting traces.

Figure 6:
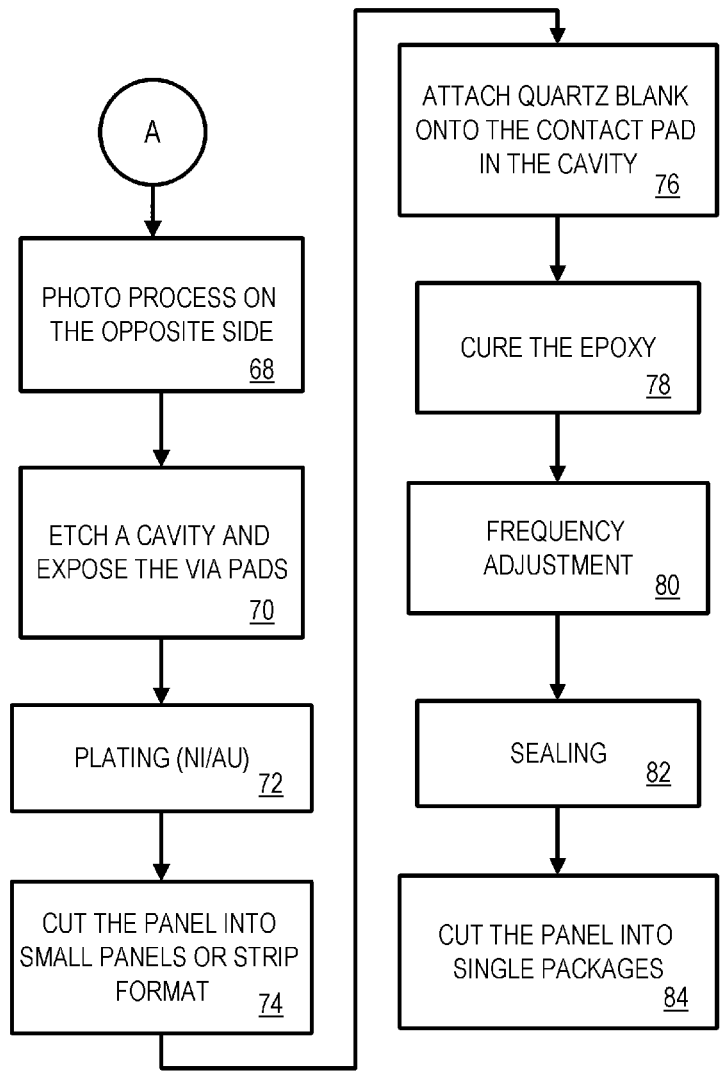
FIG. 6 is a flowchart of a continuation of the first process operating on the other side of the metal sheet.

FIG. 6 is a flowchart of a continuation of the first process operating on the other side of the metal sheet. The metal sheet produced by the first process of FIG. 5 is flipped over and the other surface operated upon. Photo-resist is applied to this other side, which is the lid or cover side of the metal package body, step 68. The photo-resist is exposed and developed. A metal etch, step 70, creates the inner cavities by etching away metal from the opening in the photo-resist. Etching is continued to a depth that reaches the gold or nickel plated metal layer 30 over via metal 34 in the drilled vias.

A nickel-gold plating is performed on the via areas within the inner cavities 10, step 72. Plating occurs where metal is connected to a charge. The external pads 32 can be connected to a power supply while the metal package bodies 18 are uncharged or grounded to perform plating on plated metal layer 30 over the drilled vias and not on the metal package bodies and the non-via body metal within inner cavities 10.

The metal sheet is scribed, etched, or cut into smaller panels, step 74. For example, a metal sheet of 100 metal package bodies 18 may be separated into several panels of 8 metal package bodies 18 per panel. Different sizes of packages, panels, and metal sheets can lead to a wide variety of different numbers of packages per panel and per sheet.

A drop of conductive epoxy 12 is applied to the plated metal layer over the filled-in vias within inner cavities 10, and crystal blank 14 aligned and pushed into the conductive epoxy drop, step 76. The conductive epoxy is cured, step 78. The crystal blank may be tested and adjusted for frequency, step 80. Bad packages or crystal blanks could be marked such as by inking, or by remembering locations of bad parts.

Nitrogen or other inert gas is blown over inner cavities 10, or a vacuum is applied, as the cover is aligned and attached to seal inner cavity 10, step 82. The panel is then cut into individual metal package bodies that are assembled with the crystal blanks inside the inner cavities, step 84. Further testing could be performed.

Annular Etch Process—FIGS. 7–10

Figure 7:
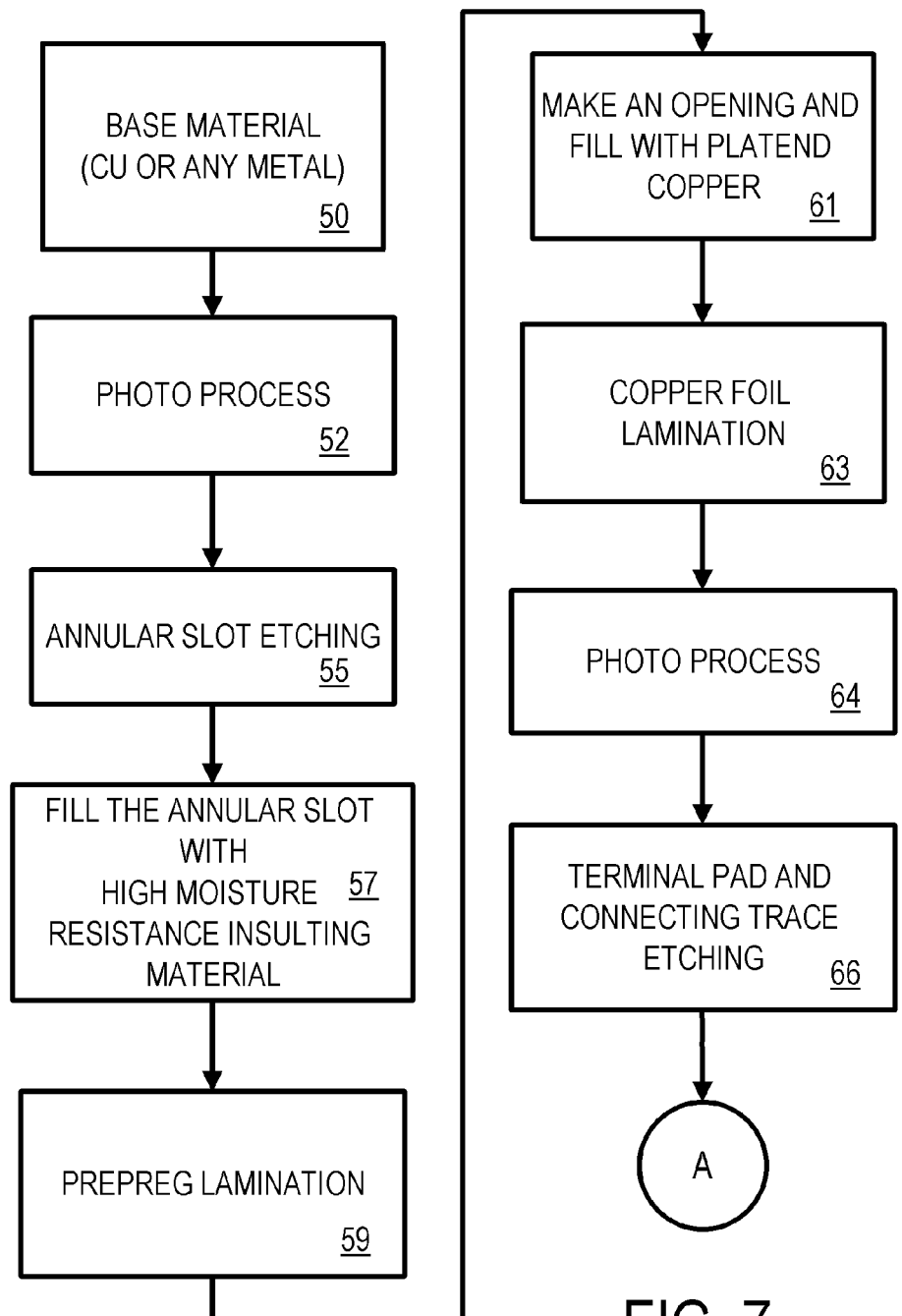
FIG. 7 is a flowchart of a second, alternative process for making a surface-mount package having a metal package body.

FIG. 7 is a flowchart of a second, alternative process for making a surface-mount package having a metal package body. This second embodiment corresponds to FIGS. 8–10. The base material is a metal such as copper, copper-alloy, or iron-nickel, step 50. The material can be a sheet that allows for many metal package bodies 18 to be formed thereon. Photo-resist is applied to one surface of the metal sheet, step 52, and the photo resist is exposed using a pattern and developed. The openings in the developed photo-resist are etched, step 55, to create etched ring slot 27. The remaining photo-resist is stripped off.

Rather than have one circular opening per via, as in the first process, an annular or ring opening in the photo-resist is made. The ring opening has the middle filled in with the original sheet metal of body 18, like a doughnut rather than a solid round pie. Drilling and filling in the drilled hole with copper metal is not required. The ring opening produces an annular slot in the metal package body 18 after etching. Etched ring slot 27 appears as a ring from the top (similar in shape to the ring of insulator 22 in FIG. 10A), or as two slots from the cross-sectional side view (FIG. 8D).

A moisture-resistant insulating material such as glass or a glass-silica filled polymer epoxy material is applied to the surface of the metal sheet, and the insulator fills in etched ring slot 27, step 57. This produces a ring of insulator 22. A prepeg preparation process (such as glass fibers in an epoxy) is used to prepare the surface of the metal sheet for later lamination, step 59.

An opening in the top insulator is formed, and this opening is plated with metal filler 33 to fill it in with metal over the metal island, step 61. Since the metal island in the middle of etched ring slot 27 was never drilled, insulator 22 in etched ring slot 27 remains around the perimeter walls of the metal-island.

The metal island becomes via metal 34, although it is not etched and plated, but is formed from the original metal sheet.

Copper foil is laminated onto the surface of the metal sheet, step 63. Etched ring slot 27 that was filled in with the insulator, and metal filler 33, are covered over by plated copper in step 63 with the laminated copper foil.

Photo-resist is applied to the copper-foil surface, and exposed and developed to form a pattern of external pads 32 and any connecting buses or traces, step 64. A metal etch is then performed, step 66, to pattern the copper foil into external pads 32 and any connecting traces. The process continues with the same flow described in FIG. 6.

Figure 8A:
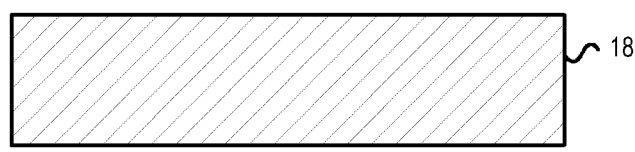
FIGS. 8A–K show steps in an annular-etch process to make the metal surface-mount crystal package that operate on the mounting surface.
Figure 8B:
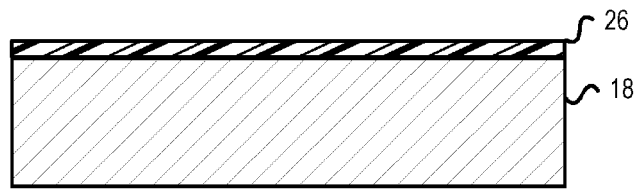
Figure 8C:
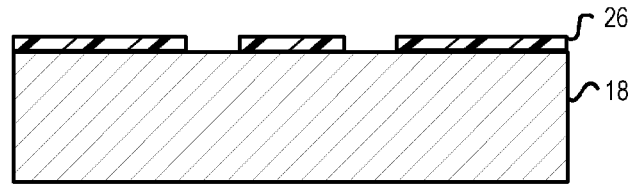
Figure 8D:
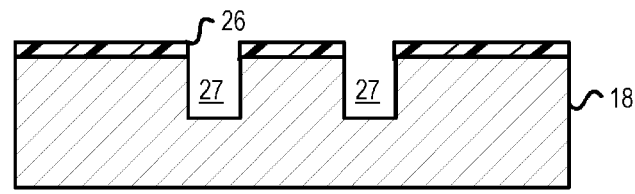

FIGS. 8A–K show steps in an annular-etch process to make the metal surface-mount crystal package that operate on the underside surface. In FIG. 8A, a sheet of metal material such as copper, copper-alloy, nickel-iron, or other metal is the starting material. This metal forms metal package body 18. In FIG. 8B, a photo-sensitive layer such as a photo-resist is placed on the top surface of the metal sheet, such as by spinning it on. Resist layer 26 is then exposed using a mask to shade portions of it and developed, leaving one or more holes or openings in resist layer 26 as shown in FIG. 8C.

Figure 8E:
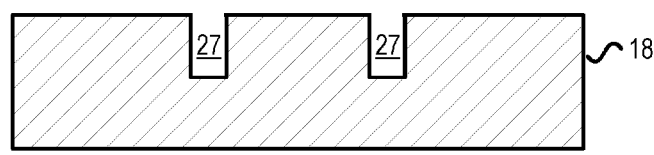

In FIG. 8D, etching is performed to create etched ring slot 27 in metal package body 18 where the opening in resist layer 26 has exposed metal package body 18 to the etchant. Resist layer 26 is then removed, leaving metal package body 18 with etched ring slot 27 in it, as shown in FIG. 8E.

Figure 8F:
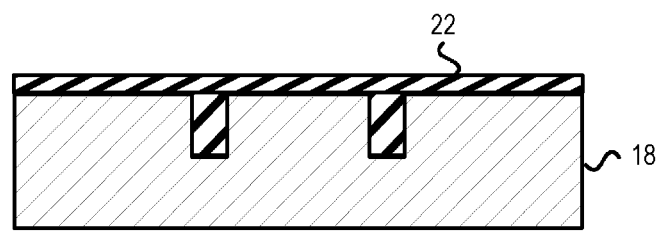

Insulator 22 is then deposited over the surface of metal package body 18 (FIG. 8F). Etched ring slot 27 is filled in with insulator 22. A flat top surface to insulator 22 can be achieved by a spin-on insulating material that can flow to fill in etched ring slot 27. Alternately, insulator 22 can be deposited to fill in etched ring slot 27 and then etched back to provide a flat surface to metal package body 18, and then additional insulator 22 material can be deposited over the flat surface of metal package body 18.

Figure 8G:
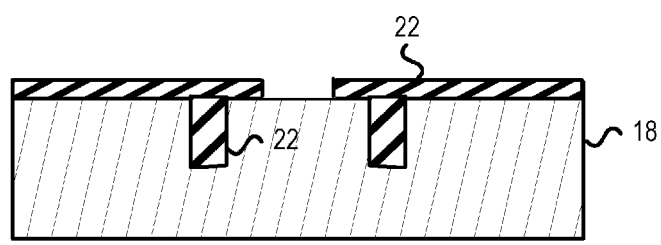

In FIG. 8G, another resist layer is spun on, exposed, and developed. Insulator 22 is etched where openings in the resist layer are, such as over the middle metal island within etched ring slot 27. The resist layer is removed, leaving the opening in insulator 22 above the metal island in the middle of filled-in etched ring slot 27.

Figure 8H:
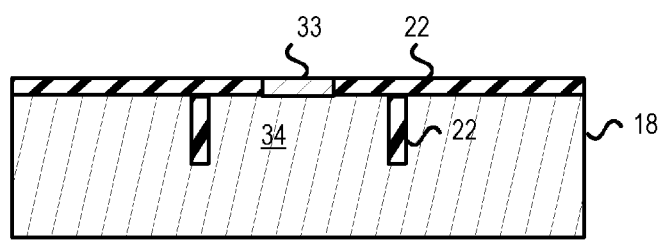

In FIG. 8H, metal filler 33 is formed in the opening in insulator 22 by electroplating. The metal in package body 18 between filled-in etched ring slot 27 acts as via metal 34.

Figure 8I:
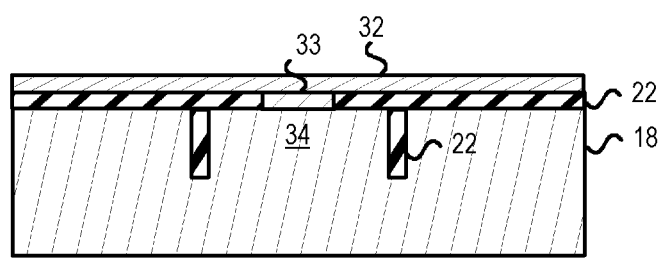

In FIG. 8I, a layer of metal is deposited over insulator 22 and over metal filler 33 that is over via metal 34. This metal layer is used to form all of external pads 32. This metal makes electrical contact with metal filler 33 but is insulated from metal package body 18 (outside of via metal 34) by insulator 22. Rather than deposit the metal, a metal foil such as a copper foil may be laminated onto the surface.

Figure 8J:
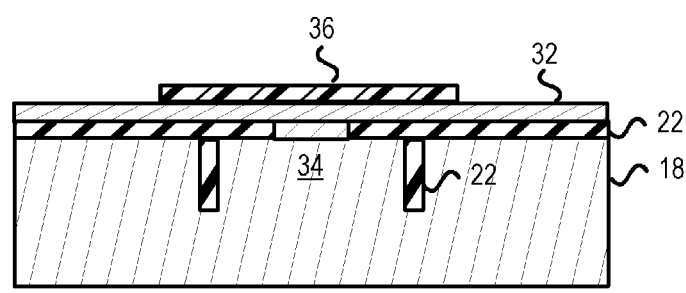
Figure 8K:
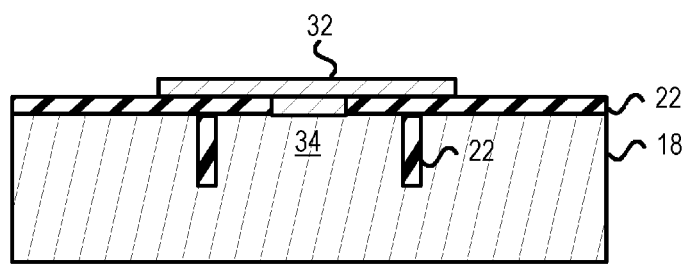

In FIG. 8J, another resist layer 36 is deposited over the top metal layer forming external pads 32. This resist layer 36 is exposed using a mask and developed to form patterns in resist layer 36. Openings in resist layer 36 expose the top metal layer for etching. After metal etching, only external pads 32 in the top metal layer remain, as shown in FIG. 8K after removal of resist layer 36.

FIGS. 9A–D show steps in a process to make the metal surface-mount crystal package that operate on the top-side surface. The surface mount package of FIG. 8K is flipped over so that steps can be operated on the top-side surface rather than the bottom or under-side surface of metal package body 18.

The inverted metal package body 18 has a photo-resist layer applied to the surface opposite external pads 32. The resist layer is exposed using a mask or a scanning beam, and developed. Then etching is performed to make inner cavity 10, and the remaining portions of resist layer 25 are removed, FIG. 9A. A plated metal layer 30 may be electroplated with a more durable metal than metal package body 18. Plated metal layer 30 may resist etching and protrude somewhat from the bottom of inner cavity 10 as shown. Some processes may skip plated metal layer 30 altogether.

The metal sheet containing many metal package bodies 18 can be separated into panels of a few metal package bodies 18. Scribe lines can be pre-etched to facilitate later separating into individual metal package bodies 18 to remove stress when sawing. Alternatively, separating into panels and into individual packages can be performed by sawing or other cutting.

Figure 9A:
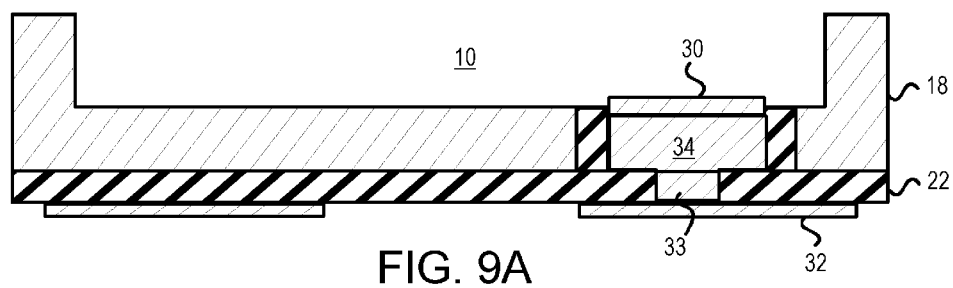
FIGS. 9A–B show steps in a process to make the metal surface-mount crystal package that operate on the top-side surface.
Figure 9B:
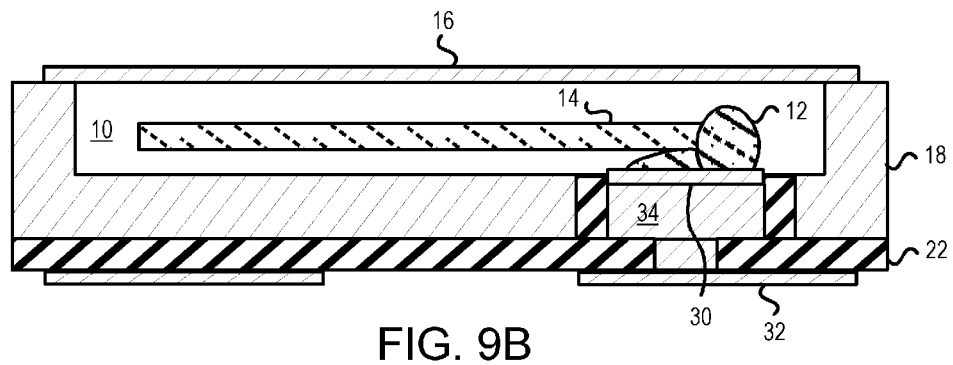

In FIG. 9B, conductive epoxy 12 is applied to plated metal layer 30 within inner cavity 10. Plated metal layer 30 over via metal 34 acts as an attach pad. Then crystal blank 14 is placed over inner cavity 10, aligned, and pushed into conductive epoxy 12. Conductive epoxy 12 is then cured, such as by exposure to heat or ultra-violet or other light.

Cover 16 is then attached to metal package body 18 over inner cavity 10. Cover attachment can be performed in a pure nitrogen-gas (N2) atmosphere to keep moisture out of inner cavity 10 during sealing. After assembly the individual metal package bodies 18 on a panel can be separated by sawing the scribe lines between metal package bodies 18.

Conductive epoxy 12 can be applied as two drops or balls as shown in FIG. 9D, or as a single drop or ball as shown in FIG. 1. One of the electrodes on crystal blank 14 is contacted by conductive epoxy 12.

Using the annular process, insulator 22 has an overhang or lip that protrudes into via metal 34 as can be seen in FIG. 9B. This lip may produce more reliable packages since via metal 34 is better sealed from moisture. This second process may be simpler to implement.

Figure 10A:
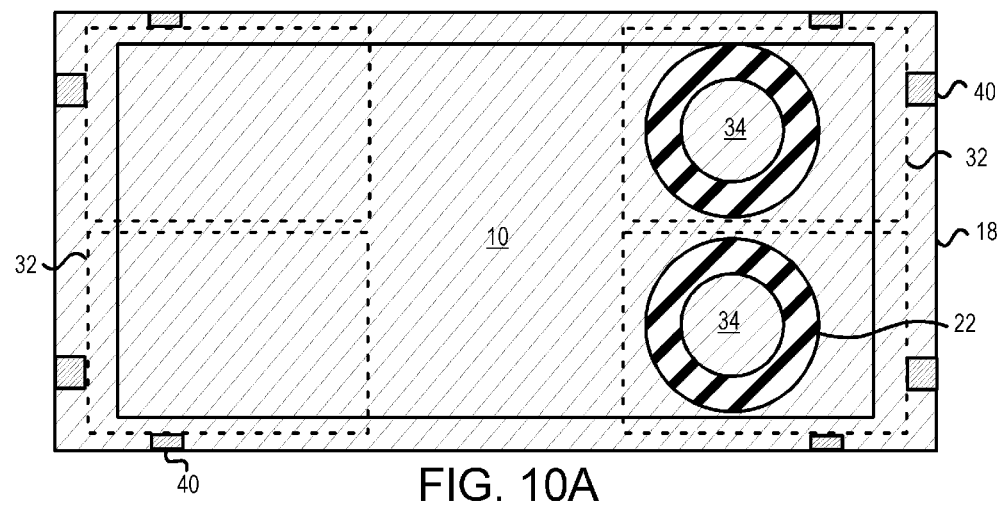
FIG. 10A is a top view and FIG. 10B is a cross-sectional side view of the surface-mount metal package body produced by the annular process of FIGS. 7–9.
Figure 10B:
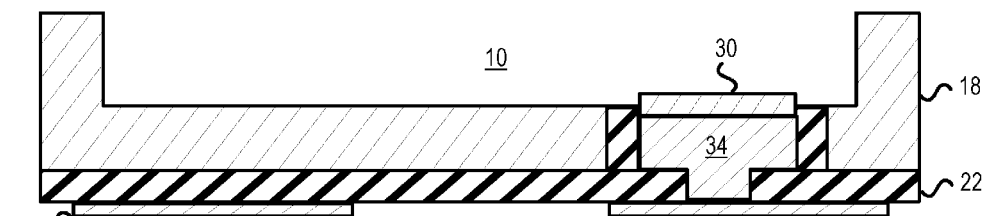

FIG. 10A is a top view and FIG. 10B is a cross-sectional side view of the surface-mount metal package body produced by the annular process of FIGS. 7–9. Cover 16, crystal blank 14, and conductive epoxy 12 are removed in these diagrams.

Four external pads 32 are formed near the four corners of metal package body 18. Since there are only two terminals of crystal blank 14, pairs of these external pads 32 may be shorted together, or two may be left floating and used for mechanically supporting metal package body 18 when surface-mounted to a PCB.

Inside inner cavity 10 are two circles of metal filler 33 and via metal 34, each one connecting to one of the underlying external pads 32. Electrical connection from crystal blank 14 inside inner cavity 10 is provided through via metal 34 to external pads 32. Via metal 34 is the metal body sheet within the annular ring of insulator 22 that filled in etched ring slot 27.

Via metal 34 is separated from metal package body 18 by insulator 22 on the sides of via metal 34, forming a doughnut or ring shape around plated metal layer 30 as shown in the top view (FIG. 10A).

Insulator 22 protrudes into via metal 34 rather than ending at the edge of via metal 34 as shown for FIG. 4B. This may provide better moisture resistance and increased reliability. Inner cavity 10 may be better sealed by the overlap of insulator 22 and via metal 34. Edge connecting metal pads 40 connect to all external pads 32, and to the edge of the package. When many packages are formed on a panel, these edge connecting metal pads 40 connect to metal lines within the scribe lines between packages, and can be powered during plating. Thus external pads 32 are electrically charged during plating by connection with buses in the scribe lines through edge connecting metal pads 40. The scribe-line buses are disconnected, isolating each external pad 32, during package separation or sawing of the scribe lines.

ALTERNATE EMBODIMENTS

Several other embodiments are contemplated by the inventor. For example various materials may be used for insulator 22, resist layer 26, via metal 34, and metal package body 18. Rather than use light to expose the photo-resist, an electron beam or X-ray beam or other radiation may be used to expose the resist. The drilled vias may be formed using a laser, mechanical drill, or a chemical etch, or some combination. More complex circuits could be encapsulated within inner cavity 10, or more than one die could be placed within inner cavity 10.

In another embodiment, a second chip with the oscillator circuit may be placed inside the same surface-mount package with the crystal blank.

Terms such as up, down, top, bottom, etc. are relative and can be interchangeable, depending on orientation. For example, the mounting surface that has the external pads can be the bottom surface when mounted to the top side of a PCB, but be a top surface when mounted to a bottom surface of the PCB. During manufacturing, the work piece may be flipped, rotated, etc. several times.

The plated metal layer contact pads could be part of the via metal rather than a separate layer. A sharp or a gradual change or gradient in alloy composition of the plated metal layer and via metal could be produced. Other layers could be inserted.

Additional features and devices could be formed by the process, such as unused or unconnected external pads, wiring traces, capacitors, resistors, etc. Modified half-etched cavities and drilled vias could be included that short one or more of the external pads to the metal package body. Rather than ring or circle shapes, other shapes could be used for the half-etched cavities, drilled vias, and etched ring slots.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A method for making a metal surface-mount package comprising:
    etching half-etched cavities into a mounting surface of a metal sheet substrate, the half-etched cavities reaching only partially and not completely through the metal sheet substrate to an opposite surface to the mounting surface;
    filling the half-etched cavities with an insulator;
    forming drilled vias within the half-etched cavities wherein side edges of the drilled vias are insulator and not metal, wherein bottoms of the drilled vias reach the metal sheet substrate;
    forming a contact metal layer on the bottoms of the drilled vias;
    filling the drilled vias with via metal;
    forming and patterning metal over the via metal and over the mounting surface to form external metal pads on the mounting surface, the external metal pads electrically contacting the via metal and the contact metal layer;
    forming inner cavities in the opposite surface that each reach the contact metal layer for at least two of the drilled vias filled with via metal;
    placing conductive epoxy on the contact metal layer within the inner cavities;
    placing a die onto the conductive epoxy, wherein electrodes on the die make contact with the conductive epoxy; and
    sealing the die within the inner cavity by covering the inner cavity with a cover, whereby the die is packaged in the metal surface-mount package with external metal pads on the mounting surface for surface mounting the metal surface-mount package to a printed-circuit board (PCB).

2. The method of claim 1 wherein etching half-etched cavities further comprises depositing a resist layer onto the mounting surface, patterning the resist layer, developing the resist layer to form openings in the resist layer, and etching the metal sheet substrate through the openings in the resist layer to form the half-etched cavities.

3. The method of claim 2 wherein the resist layer is a photo or radiation-sensitive layer.

4. The method of claim 1 wherein forming drilled vias within the half-etched cavities comprises drilling with a mechanical drill or with a laser, or etching.

5. The method of claim 1 wherein filling the drilled vias with via metal comprises plating or depositing the via metal into the drilled vias.

6. The method of claim 5 wherein the via metal is copper or a copper alloy.

7. The method of claim 1 wherein forming and patterning metal over the via metal and over the mounting surface to form external metal pads on the mounting surface comprises attaching a metal foil to the mounting surface and patterning the metal foil to form the external metal pads.

8. The method of claim 1 wherein the cover is metal.

9. The method of claim 1 wherein sealing the die comprises blowing relatively inert gas onto the die while the cover is being attached.

10. The method of claim 9 wherein the relatively inert gas is nitrogen.

11. The method of claim 1 wherein the metal sheet substrate is copper, a copper alloy, or a nickel-iron alloy.

12. The method of claim 11 wherein forming the contact metal layer comprises forming a gold-nickel layer.

13. The method of claim 11 wherein forming the contact metal layer comprises electro-plating a gold-nickel layer.

14. The method of claim 1 further comprising:
    separating the metal sheet substrate into a plurality of metal package bodies, each metal package body having an inner cavity sealing a die within, each die electrically connected to at least two of the external metal pads through at least two of the half-etched cavities filled with the via metal.

15. The method of claim 1 wherein the die in the inner cavity is a crystal blank for an oscillator.

16. The method of claim 15 further comprising:
    curing the conductive epoxy after the die is placed onto the conductive epoxy.

17. The method of claim 1 further comprising:
    covering the mounting surface of the metal sheet substrate with an insulator after the half-etched cavities are formed,
    whereby the external metal pads are separated from metal package bodies by the insulator.

18. A manufacturing process comprising:
    applying a first resist to a mounting surface of a metal sheet and patterning the first resist to form first openings to the metal sheet;
    etching half-etched cavities in the first openings on the mounting surface of the metal sheet;
    removing the first resist and applying an insulator onto the mounting surface so that the insulator fills the half-etched cavities to form filled cavities;
    drilling holes within the half-etched cavities so that the holes are surrounded by the insulator but have a depth sufficient to reach metal under the filled cavities;
    filling the holes with metal to form via-metal-filled holes;
    applying a metal layer to the mounting surface and patterning the metal layer into external pads on the mounting surface, wherein the external pads connect to the via-metal-filled holes;
    applying a second resist to a second surface opposite the mounting surface of the metal sheet and patterning the second resist to form second openings to the metal sheet;

etching die cavities that are larger than the half-etched cavities in the second openings on the second surface of the metal sheet;

wherein the die cavities are sufficiently deep to reach the metal in the via-metal-filled holes;

applying conductive epoxy into the die cavities in the second surface, the conductive epoxy placed onto the metal in the via-metal-filled holes exposed inside the die cavities;

placing die within the die cavities so that each die contacts at least two via-metal-filled holes through the conductive epoxy; and sealing the die cavity and separating the metal sheet into metal packages that contain die in the die cavities, but are mounted to printed-circuit boards by the external pads on the mounting surface.

* * * * *